(12) United States Patent
Kim et al.

(10) Patent No.: US 9,543,150 B2
(45) Date of Patent: Jan. 10, 2017

(54) SYSTEMS AND METHODS FOR FORMING ULTRA-SHALLOW JUNCTIONS

(71) Applicant: LAM RESEARCH CORPORATION, Fremont, CA (US)

(72) Inventors: Yunsang Kim, Monte Sereno, CA (US); YounGi Hong, Pleasanton, CA (US); Ivan Berry, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 3 days.

(21) Appl. No.: 14/735,541

(22) Filed: Jun. 10, 2015

(65) Prior Publication Data

US 2016/0365251 A1    Dec. 15, 2016

(51) Int. Cl.
*H01L 21/265* (2006.01)
*H01L 21/225* (2006.01)
*H01L 21/30* (2006.01)
*H01L 21/324* (2006.01)
*H01L 21/02* (2006.01)

(52) U.S. Cl.
CPC ..... *H01L 21/2256* (2013.01); *H01L 21/02041* (2013.01); *H01L 21/2658* (2013.01); *H01L 21/3003* (2013.01); *H01L 21/324* (2013.01)

(58) Field of Classification Search
CPC .............. H01L 21/02227; H01L 21/02296; H01L 21/041; H01L 21/0415; H01L 21/0455; H01L 21/2656
See application file for complete search history.

(56) References Cited

U.S. PATENT DOCUMENTS

| | | |
|---|---|---|
| 5,770,982 A | 6/1998 | Moore |
| 5,952,896 A | 9/1999 | Mett et al. |
| 6,054,013 A | 4/2000 | Collins et al. |
| 6,254,738 B1 | 7/2001 | Stimson et al. |
| 6,313,584 B1 | 11/2001 | Johnson et al. |
| 7,218,899 B2 | 5/2007 | Sorrells et al. |
| 7,480,571 B2 | 1/2009 | Howald et al. |
| 7,539,474 B2 | 5/2009 | Sorrels et al. |
| 7,780,814 B2 | 8/2010 | Pipitone et al. |
| 7,811,410 B2 | 10/2010 | Leming et al. |
| 9,059,678 B2 | 6/2015 | Long et al. |
| 2004/0027209 A1 | 2/2004 | Chen et al. |
| 2013/0135058 A1 | 5/2013 | Long et al. |
| 2014/0011347 A1* | 1/2014 | Yerushalmi et al. ........... H01L 21/2225 438/546 |

* cited by examiner

*Primary Examiner* — Cheung Lee

(57) ABSTRACT

A method for forming a junction on a substrate includes removing a native oxide layer of a bulk material; doping an outer layer of the bulk material with molecular hydrogen to create a hydrogen-doped outer layer; and nano-doping the hydrogen-doped outer layer using one of boron or phosphorous to a target junction depth to create a nano-doped layer.

27 Claims, 6 Drawing Sheets

SYSTEMS AND METHODS FOR FORMING ULTRA-SHALLOW JUNCTIONS

FIELD

The present disclosure relates to substrate processing systems and more particularly to substrate processing systems and methods for forming ultra-shallow junctions.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A multi-gate field-effect transistor (FET) incorporates more than one gate into a single device. The multiple gates may be controlled by a single gate electrode or by independent gate electrodes. Multi-gate FETs are one of the several strategies being developed by manufacturers to create smaller microprocessors and memory cells.

Initially, the term FinFET was used to describe a field effect transistor (FET) including a conducting channel that is wrapped by a thin silicon "fin", which forms a body of the FinFET. A thickness of the fin (measured in the direction from source to drain) determines an effective channel length of the FinFET. A wrap-around gate structure improves electrical control over the conducting channel to reduce leakage current and overcome other short-channel effects. More recently, the term FinFET is used to generically describe any fin-based, multi-gate transistor architecture regardless of number of gates. Vertical gate all around (VGAA) FETs are similar in concept to FinFETs except that a gate material surrounds a channel region on all sides.

Formation of FinFET, VGAA and other structures such as buried bit lines (BBLs) are difficult due to the complexity and controllability encountered when forming a 3-D structure. Current methods limit the patterning size due to the method of doping that is used to produce conformal doping.

SUMMARY

A method for forming a junction on a substrate includes removing a native oxide layer of a bulk material; doping an outer layer of the bulk material with molecular hydrogen to create a hydrogen-doped outer layer; and nano-doping the hydrogen-doped outer layer using one of boron or phosphorous to a target junction depth to create a nano-doped layer.

In other features, the method includes one of oxidizing the nano-doped layer or nitridating the nano-doped layer. Oxidizing the nano-doped layer includes using a gas mixture including silane, nitrous oxide and molecular nitrogen. Nitridating the nano-doped layer includes using a gas mixture including silane, ammonia and molecular nitrogen.

In other features, the method includes annealing the substrate. The method includes removing at least part of the nano-doped layer. Removing the at least part of the nano-doped layer includes etching using wet etching or dry etching. Removing the native oxide layer comprises exposing the substrate to plasma that includes molecular hydrogen as a plasma gas.

In other features, doping the outer layer with molecular hydrogen includes exposing the substrate to at least one of plasma, atomic layer deposition or a spin on dielectric. The bulk material includes one of silicon, germanium (Ge) or SiGe. The nano-doping includes exposing the substrate to at least one of plasma, atomic layer deposition and a spin on dielectric. The annealing includes one of laser annealing, rapid thermal processing (RTP) or flash annealing.

In other features, removing the native oxide layer comprises exposing the substrate to plasma that includes ammonia and argon as a plasma gas. After removing the native oxide layer of the bulk material and prior to doping the outer layer of the bulk material with molecular hydrogen, the method includes removing fluorine residue. Removing the fluorine residue includes exposing the substrate to plasma including molecular hydrogen as a plasma gas. The junction is formed on at least one of a fin field effect transistor (FINFET), a gate all around (GAA) transistor, and a buried bit line (BBL) and wherein the junction has a thickness of 8 to 12 nm. The removing, doping and nano-doping are performed in an inductively coupled plasma (ICP) substrate processing system.

A method for forming a junction on a substrate includes removing a native oxide layer of a bulk material of the substrate; eliminating fluorine residue on a surface of the bulk material; doping an outer layer of the bulk material with molecular hydrogen to create a hydrogen-doped outer layer; oxidizing the hydrogen-doped outer layer to create an oxidized outer layer; removing at least part of the oxidized outer layer; and nano-doping using one of phosphorous or arsenic to a target junction depth to create a doped layer.

In other features, the oxidizing includes oxidizing the doped layer using a gas mixture including silane, nitrous oxide and molecular nitrogen. The method includes annealing the substrate. Removing the oxidized outer layer includes etching using plasma with ammonia and argon as plasma gases. Doping the outer layer with molecular hydrogen includes exposing the substrate to at least one of plasma, atomic layer deposition or a spin on dielectric. The bulk material includes silicon.

In other features, the nano-doping includes exposing the substrate to at least one of plasma, atomic layer deposition and a spin on dielectric. The annealing includes one of laser annealing, rapid thermal processing (RTP) or flash annealing. The junction is formed on at least one of a fin field effect transistor (FINFET), a gate all around (GAA) transistor, and a buried bit line (BBL) and wherein the junction has a thickness of 8 to 12 nm. The removing, doping and nano-doping are performed in an inductively coupled plasma (ICP) substrate processing system.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
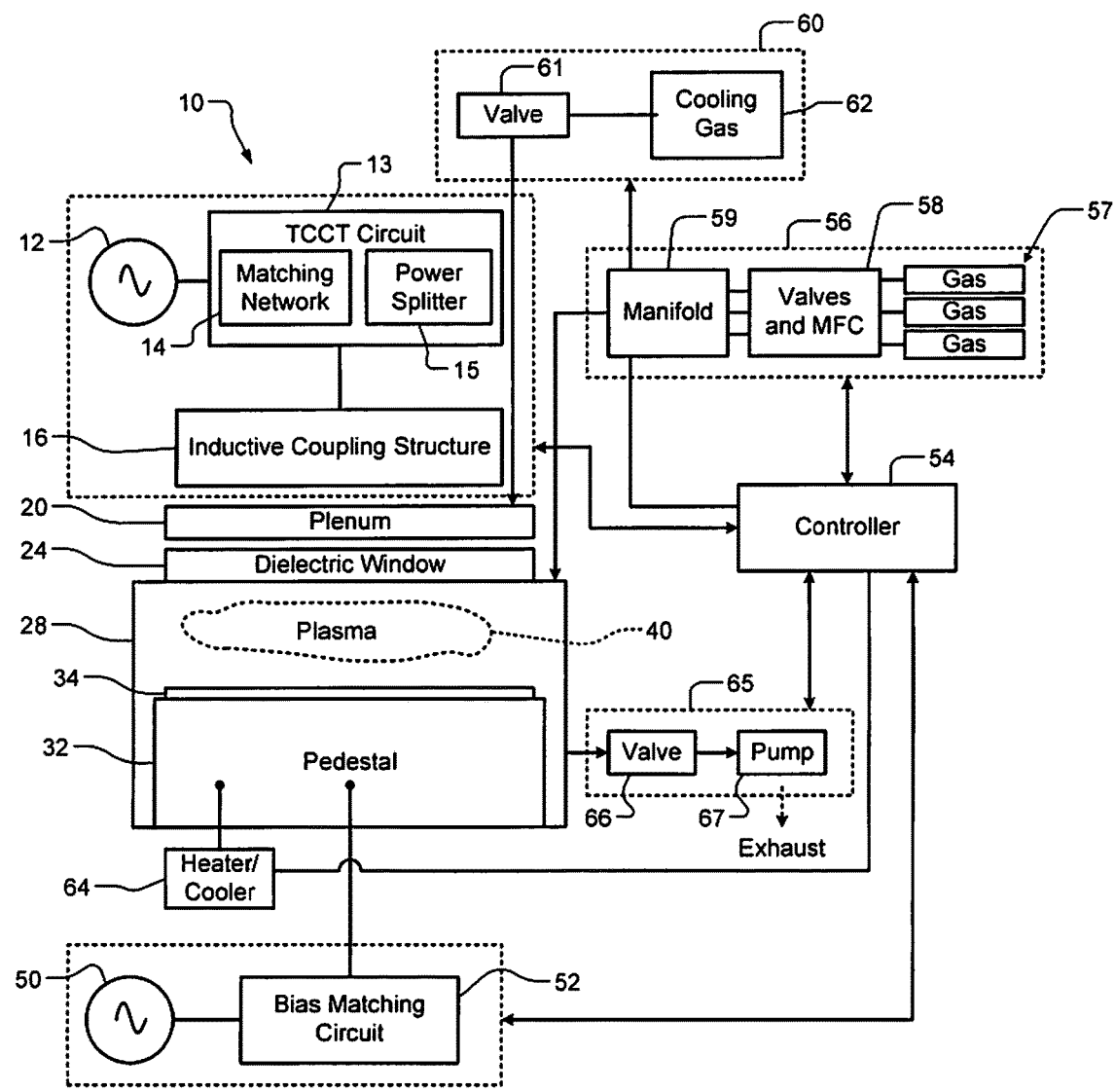
FIG. 1 is a functional block diagram of an example of a substrate processing system according to the present disclosure.

Referring now to FIG. 1, an example of a substrate processing system 10 that can be used to perform nano-doping and to create an ultra-shallow junction (USJ) according to the present disclosure is shown. While the foregoing description relates to an inductively coupled plasma (ICP) system, other types of ICP systems or other plasma processing systems may be used. The substrate processing system 10 includes an RF source 12 connected to a transformer coupled capacitive tuning (TCCT) circuit 13, which outputs current to an inductive coil structure 16.

The TCCT circuit 13 typically includes a matching network 14 and a power splitter 15. The matching network 14 may be connected by a transmission line to the RF source 12. The matching network 14 matches an impedance of the RF source 12 to the rest of the circuit including the power splitter 15 and the inductive coil structure 16. An example of a TCCT circuit 13 is shown and described in commonly assigned U.S. Publication No. 2013/0135058 to Long et al., which is hereby incorporated by reference in its entirety. In some examples, the inductive coil structure 16 may include a single inductive coil, a pair of inductive coils, or an inner inductive coil pair and an outer inductive coil pair. The power splitter 15 may be used to control the relative amount of inductive current supplied to coils of the inductive coil structure 16. While flat coils are shown, other types of coils may be used.

A gas plenum 20 may be arranged between the inductive coil structure 16 and a dielectric window 24. The dielectric window 24 is arranged along one side of a processing chamber 28. The processing chamber 28 further comprises a pedestal 32 that supports a substrate 34. The pedestal 32 may include an electrostatic chuck, a mechanical chuck or other type of chuck. Plasma 40 is generated inside of the processing chamber 28. The plasma 40 may be used to deposit film or to etch the substrate 34. An RF source 50 and a bias matching circuit 52 may be used to bias the pedestal 32 during operation.

A gas delivery system 56 may be used to supply a gas mixture to the processing chamber 28 adjacent to the dielectric window 24. The gas delivery system 56 may include process gas sources 57, a metering system 58 such as valves and mass flow controllers, and a manifold 59 to mix the process gases.

A gas delivery system 60 may be used to deliver gas 62 via a valve 61 to the gas plenum 20. The gas may include cooling gas that is used to cool the inductive coil structure 16 and the dielectric window 24. A heater 64 may be used to heat the pedestal 32 to a predetermined temperature. An exhaust system 65 includes a valve 66 and pump 67 to remove reactants from the processing chamber 28 by purging or evacuation.

A controller 54 may be used to control the etching process. The controller 54 monitors process parameters such as temperature, pressure, etc. and controls delivery of the gas mixture, striking, maintaining and extinguishing the plasma, removal of reactants, supply of cooling gas, etc.

Figure 2:
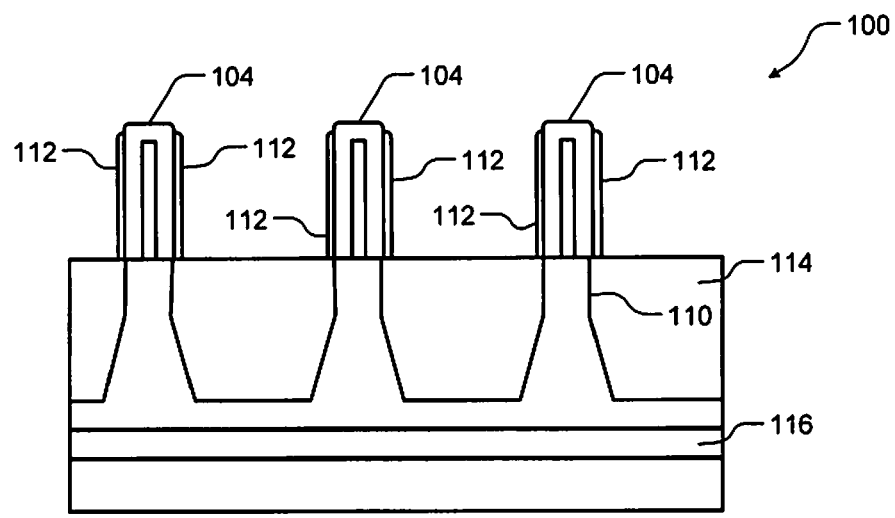
FIG. 2 is a cross-sectional view of an example of a FINFET including a junction formed on one or more gates according to the present disclosure.

Referring now to FIGS. 2 to 5, various non-limiting examples of junctions with nano-scale doping of USJs according to the present disclosure are shown. In FIG. 2, an example of a FINFET 100 is shown. The FINFET 100 includes one or more gates 104. Fins 110 (extending into and out of the page including FIG. 2) define sources and drains (both not shown). Junctions 112 with nano-scale doping according to the present disclosure are formed on the one or more surfaces of the gates 104. Layers 114 and 116 may be made of oxide such as silicon oxide ($SiO_2$).

Figure 3:
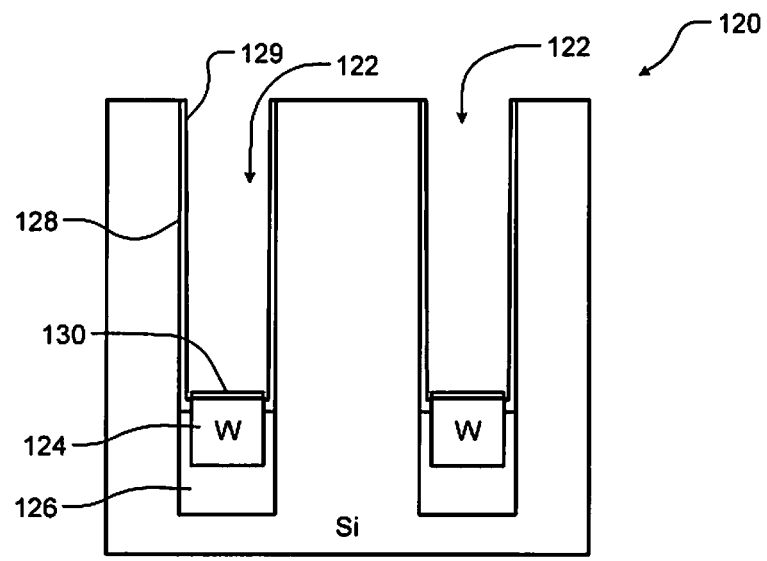
FIG. 3 is a cross-sectional view of an example of a buried bit line (BBL) with a high aspect ratio including a junction formed on a tungsten layer according to the present disclosure.

In FIG. 3, a buried bit line (BBL) 120 is shown. The BBL 120 includes a trench 122 having a high aspect ratio (HAR). For example, the HAR may have an aspect ratio that is greater than 10:1. A tungsten (W) layer 124 is formed on an oxide layer 126 at a bottom portion of the trench 122. Sidewalls 128 of the trench 122 may include an insulating layer 129. A junction 130 with nano-scale doping according to the present disclosure is formed on a top surface of the tungsten layer 124.

Figure 4:
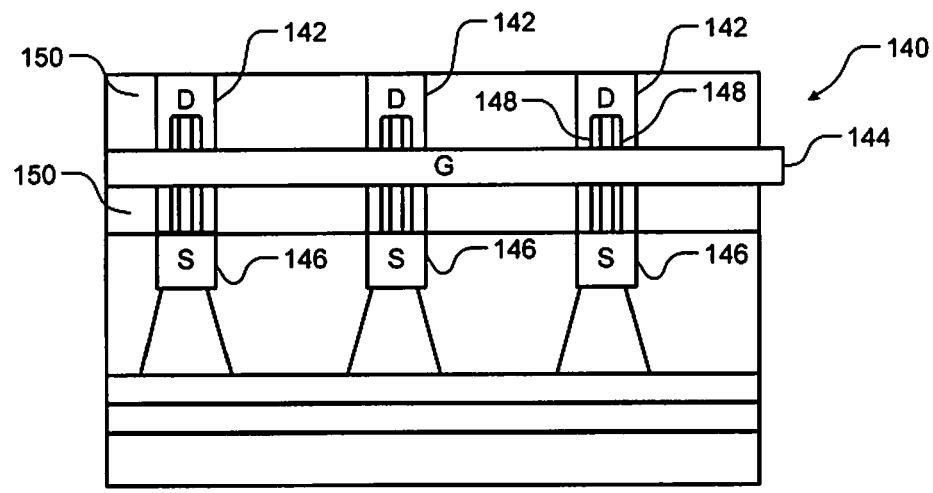
FIG. 4 is a cross-sectional view of an example of a vertical gate all around (VGAA) transistor including a junction formed thereon according to the present disclosure.

In FIG. 4, a vertical gate all around (VGAA) transistor 140 is shown. The VGAA transistor 140 includes drain regions 142, gate regions 144 and source regions 146. One of more junctions 148 with nano-scale doping are formed on the gates 144. A spin-on dielectric (SOD) layer 150 may be formed around the drain region 142 and gate region 144.

Figure 5:
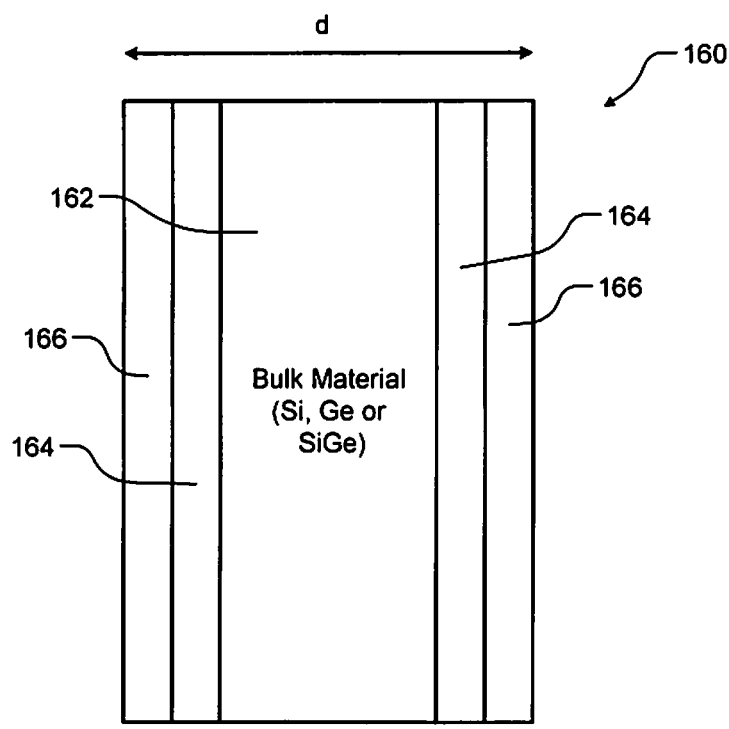
FIG. 5 is a cross-sectional view of an example of a junction according to the present disclosure.

In FIG. 5, an enlarged view of a junction 160 with nano-scale doping is shown in further detail. The junction 160 may include a bulk material 162, a first doped layer 164 and a second doped layer 166. In some examples, the bulk material 162 may include silicon (Si), germanium (Ge) or Si/Ge. In some examples, the first doped layer 164 may include the bulk material that is doped with phosphorous (P), boron (B) or arsenic (As). In some examples, the second doped layer 166 is doped with molecular hydrogen ($H_2$). In some examples, the junction 160 has a thickness of 8-12 nm. In some examples, the junction 160 has a thickness of 10 nm. In some examples, the first and second doped layers have a thickness of 1-2 nm.

Figure 6:
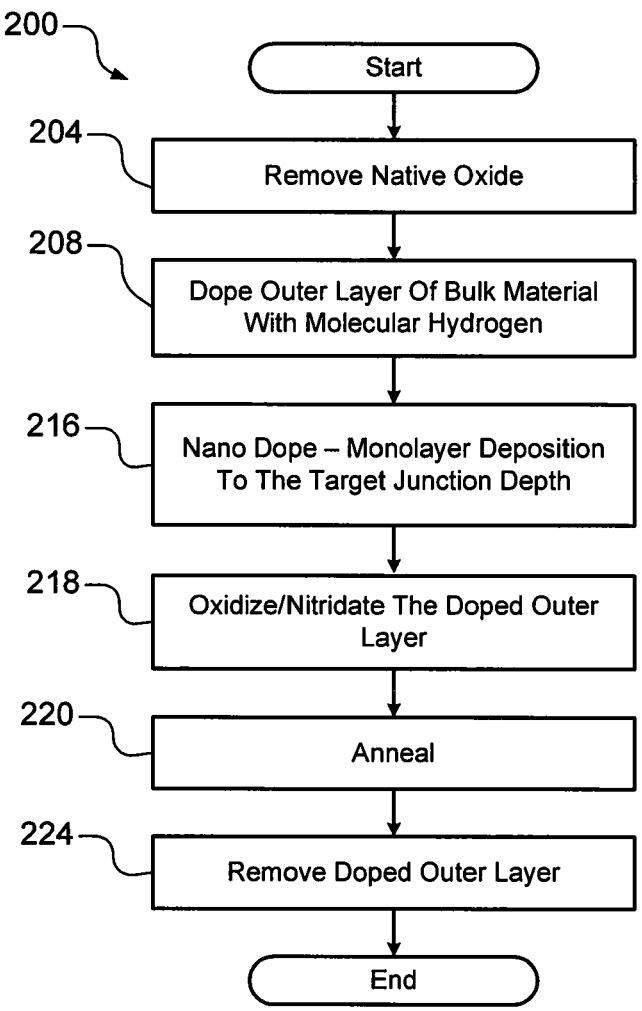
FIG. 6 is a flowchart illustrating an example of one method for forming the junction according to the present disclosure.

Referring now to FIG. 6, a method 200 for forming the nano-doped junction is shown. At 204, a native oxide layer of the bulk material is removed. In some examples, the bulk material may include silicon (Si), germanium (Ge), or Si/Ge. In some examples, the native oxide layer is removed using plasma with molecular hydrogen ($H_2$) as the plasma gas.

At 208, an outer layer of the bulk material is doped with molecular hydrogen ($H_2$) to create a hydrogen-doped layer. For example, doping may be performed using a plasma process, such as inductively coupled plasma (ICP), microwave remote plasma, or capacitively coupled plasma (CCP).

At 216, nano-doping is performed to create a nano-doped layer. In some examples, nano-doping deposits phosphorous (P) or boron (B) to a target junction depth. The nano-doping may be performed using plasma, gas phase, ALD or SOD.

In some examples, the nano-doping is performed using gas phase doping using $PH_3$ without plasma. In some examples, the gas phase doping is performed without a pedestal bias. In some examples, the gas phase soaking is performed between 0° C. to 100° C. In other examples, the gas phase soaking is performed at 20° C. The gas phase soaking can be used to form a 5 nm junction.

In some examples, the nano-doping is performed using plasma with $PH_3$ as the process gas. The process gas is supplied and the plasma is struck and maintained for a predetermined period. In some examples, the bias power is operated between 100 W and 300 W. In some examples, the plasma process is performed between 0° C. to 100° C. In other examples, the plasma process is performed at 20° C.

In some examples, the nano-doping is performed using ALD including a soaking step and a plasma activation step. The soaking step includes supplying $PH_3$ and He or $H_2$ as the process gases for a predetermined soaking period and then the plasma is supplied or struck in the processing chamber during a plasma activation step. In some examples, the process vacuum pressure is 0.5 mT to 5 T. In other examples, the plasma soaking step includes supplying $B_2H_6$ and $N_2$ as the process gases for a predetermined soaking period and then the plasma is supplied or struck in the processing chamber during a plasma activation step.

At 218, the doped outer layer is oxidized or nitridated. Oxidation may be performed using a process gas mixture of silane ($SiH_4$), nitrous oxide ($N_2O$) and molecular nitrogen ($N_2$). Nitridation may be performed using a process gas mixture of $SiH_4$, ammonia ($NH_3$) and $N_2$.

At 220, annealing is performed. In some examples, the annealing may include using a laser, rapid thermal processing (RTP) or flash annealing. In some examples, the annealing is performed at a temperature between 300° C. to 400° C. In some examples, the annealing is performed at a temperature of 330° C.

At 224, at least part of the doped outer layer is removed. In some examples, at least part of the doped outer layer is removed using wet etching or dry etching.

In some examples, steps 204-218 are performed in the ICP processing chamber and steps 220 and 224 are performed in one or more separate chambers.

Figure 7:
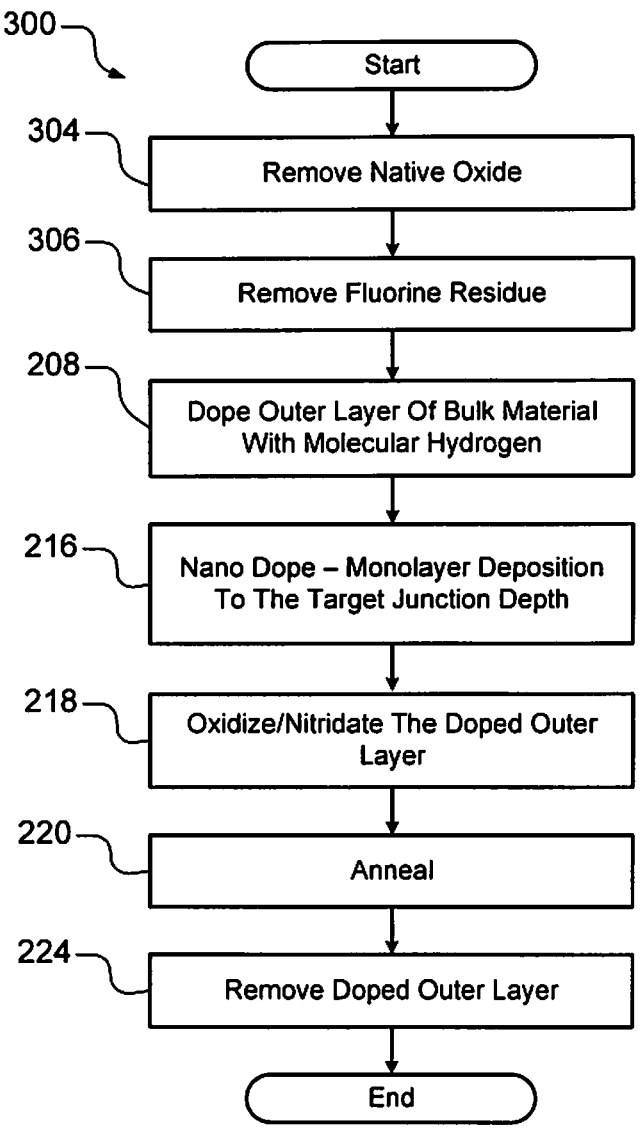
FIG. 7 is a flowchart illustrating an example of another method for forming the junction according to the present disclosure.

Referring now to FIG. 7, another method 300 for forming the junction is shown. At 304, a native oxide layer is removed. In some examples, the native oxide layer is removed using plasma with ammonia ($NH_3$) and argon (Ar) as the plasma gas. At 306, fluorine (F) residue is removed using plasma with molecular hydrogen as the plasma gas. In some examples, the plasma power is 1000 Ws, hydrogen gas is supplied at 100 sccm, argon is supplied at 50 sccm, and the process temperature is 330° C., although other process parameters may be used.

At 208, an outer layer of the bulk material is doped with molecular hydrogen ($H_2$) as described above to create a hydrogen-doped layer. At 216, nano-doping is performed as described above. At 218, the doped outer layer is oxidized or nitridated as described above. At 220, annealing is performed as described above. At 224, at least part of the doped outer layer is removed using wet or dry etching.

In some examples, steps 304, 306, 208 and 216 are performed in the ICP processing chamber and steps 220 and 224 are performed in one or more separate chambers.

Figure 8:
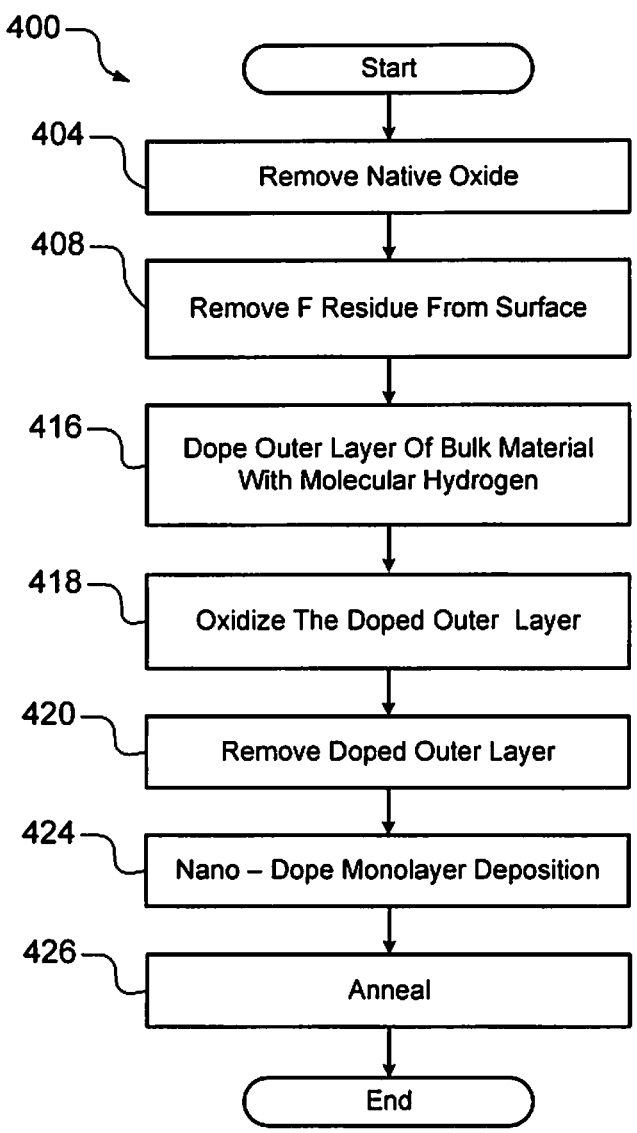
FIG. 8 is a flowchart illustrating an example of yet another method for forming the junction according to the present disclosure.

Referring now to FIG. 8, another method 400 for forming an ultra-shallow junction is shown. At 404, a native oxide layer is removed from the bulk material. For example only, the bulk material may include silicon. For example only, the native oxide layer can be removed using plasma with $NF_3$ and argon (Ar) as plasma process gases. At 408, fluorine residue is removed from an outer surface of the substrate. For example only, the fluorine residue can be removed using plasma with molecular hydrogen ($H_2$) as the plasma process gas. At 416, an outer layer of the bulk material is doped with molecular hydrogen to create a hydrogen-doped layer. For example only, plasma, ALD or SOD may be used.

At 418, the hydrogen-doped outer layer is oxidized. For example only, oxidation may be performed using a process gas mixture including silane ($SiH_4$), nitrous oxide ($N_2O$), and molecular nitrogen ($N_2$). At 420, at least part of the outer layer is removed. For example only, the outer layer may include $SiO_2$. For example only, the outer layer may be removed using wet or dry etching. At 424, nano-doping-monolayer deposition is performed to a target junction depth. At 426, annealing is performed. For example only, the annealing may be performed at low temperature. For example only, the temperature may be in a range from 850° C. to 950° C.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RE) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for forming a junction on a substrate, comprising:
    removing a native oxide layer of a bulk material;
    doping an outer layer of the bulk material with molecular hydrogen to create a hydrogen-doped outer layer; and
    nano-doping the hydrogen-doped outer layer using one of boron or phosphorous to a target junction depth to create a nano-doped layer.

2. The method of claim 1, further comprising one of:
    oxidizing the nano-doped layer; or
    nitridating the nano-doped layer.

3. The method of claim 2, wherein oxidizing the nano-doped layer includes using a gas mixture including silane, nitrous oxide and molecular nitrogen.

4. The method of claim 2, wherein nitridating the nano-doped layer includes using a gas mixture including silane, ammonia and molecular nitrogen.

5. The method of claim 2, further comprising annealing the substrate.

6. The method of claim 5, further comprising removing at least part of the nano-doped layer.

7. The method of claim 6, wherein removing the at least part of the nano-doped layer includes etching using wet etching or dry etching.

8. The method of claim 5, wherein the annealing includes one of laser annealing, rapid thermal processing (RTP) or flash annealing.

9. The method of claim 1, wherein removing the native oxide layer comprises exposing the substrate to plasma that includes molecular hydrogen as a plasma gas.

10. The method of claim 1, wherein doping the outer layer with molecular hydrogen includes exposing the substrate to at least one of plasma, atomic layer deposition or a spin on dielectric.

11. The method of claim 1, wherein the bulk material includes one of silicon, germanium (Ge) or SiGe.

12. The method of claim 1, wherein the nano-doping includes exposing the substrate to at least one of plasma, atomic layer deposition and a spin on dielectric.

13. The method of claim 1, wherein removing the native oxide layer comprises exposing the substrate to plasma that includes ammonia and argon as a plasma gas.

14. The method of claim 13, further comprising, after removing the native oxide layer of the bulk material and prior to doping the outer layer of the bulk material with molecular hydrogen, removing fluorine residue.

15. The method of claim 14, wherein removing the fluorine residue includes exposing the substrate to plasma including molecular hydrogen as a plasma gas.

16. The method of claim 1, wherein the junction is formed on at least one of a fin field effect transistor (FINFET), a gate all around (GAA) transistor, and a buried bit line (BBL) and wherein the junction has a thickness of 8 to 12 nm.

17. The method of claim 1, wherein the removing, doping and nano-doping are performed in an inductively coupled plasma (ICP) substrate processing system.

18. A method for forming a junction on a substrate, comprising:
    removing a native oxide layer of a bulk material of the substrate;
    eliminating fluorine residue on a surface of the bulk material;
    doping an outer layer of the bulk material with molecular hydrogen to create a hydrogen-doped outer layer;
    oxidizing the hydrogen-doped outer layer to create an oxidized outer layer;
    removing at least part of the oxidized outer layer; and
    nano-doping using one of phosphorous or arsenic to a target junction depth to create a doped layer.

19. The method of claim 18, wherein the oxidizing includes oxidizing the hydrogen-doped outer layer using a gas mixture including silane, nitrous oxide and molecular nitrogen.

20. The method of claim 18, further comprising annealing the substrate.

21. The method of claim 20, wherein the annealing includes one of laser annealing, rapid thermal processing (RTP) or flash annealing.

22. The method of claim 18, wherein removing the oxidized outer layer includes etching using plasma with ammonia and argon as plasma gases.

23. The method of claim 18, wherein doping the outer layer with molecular hydrogen includes exposing the substrate to at least one of plasma, atomic layer deposition or a spin on dielectric.

24. The method of claim 18, wherein the bulk material includes silicon.

25. The method of claim 18, wherein the nano-doping includes exposing the substrate to at least one of plasma, atomic layer deposition and a spin on dielectric.

26. The method of claim 18, wherein the junction is formed on at least one of a fin field effect transistor (FIN-FET), a gate all around (GAA) transistor, and a buried bit line (BBL) and wherein the junction has a thickness of 8 to 12 nm.

27. The method of claim 18, wherein the removing, doping and nano-doping are performed in an inductively coupled plasma (ICP) substrate processing system.

\* \* \* \* \*